(12) United States Patent
Kidoh et al.

(10) Patent No.: US 7,214,980 B2
(45) Date of Patent: May 8, 2007

(54) SEMICONDUCTOR DEVICE WITH A SELF-ALIGNED CONTACT (SAC) STRUCTURE

(75) Inventors: Masaru Kidoh, Kawasaki (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/055,626

(22) Filed: Feb. 11, 2005

(65) Prior Publication Data
US 2006/0097300 A1    May 11, 2006

(30) Foreign Application Priority Data
Nov. 5, 2004  (JP)  ............... 2004-322710

(51) Int. Cl.
*H01L 27/108* (2006.01)
*H01L 29/76* (2006.01)
*H01L 29/94* (2006.01)
*H01L 31/119* (2006.01)

(52) U.S. Cl. .................. 257/296; 257/298; 257/300; 257/301

(58) Field of Classification Search ............. 257/296, 257/298, 300, 301
See application file for complete search history.

(56) References Cited

U.S. PATENT DOCUMENTS

| | | | | |
|---|---|---|---|---|
| 5,843,815 A | * | 12/1998 | Liaw | .................. 438/238 |
| 6,297,530 B1 | | 10/2001 | Akatsu et al. | |
| 6,329,235 B1 | | 12/2001 | Kuo | |
| 6,444,548 B2 | * | 9/2002 | Divakaruni et al. | ........ 438/525 |

* cited by examiner

*Primary Examiner*—Thien F Tran
(74) *Attorney, Agent, or Firm*—Oblon, Spivak, McClelland, Maier & Neustadt, P.C.

(57) ABSTRACT

A semiconductor device includes a semiconductor substrate, at least two gate electrode sections formed adjacent to each other on the surface of the semiconductor substrate, a first diffusion region formed in the surface area of the semiconductor substrate, except in the gate electrode sections, a substrate contact layer formed between the gate electrode sections in self-alignment therewith, a first side-wall insulating film formed on one of side-wall portions of each of the gate electrode sections, and a second side-wall insulating film formed on other of the side-wall portions of each of the gate electrode sections. The device further includes a second diffusion region whose conductivity type is opposite to that of the first diffusion region, formed in the surface area of the semiconductor substrate and corresponding to each of the edges of the gate electrode sections, the edges corresponding to the other of the side-wall portions.

3 Claims, 15 Drawing Sheets

SEMICONDUCTOR DEVICE WITH A SELF-ALIGNED CONTACT (SAC) STRUCTURE

CROSS-REFERENCE TO RELATED APPLICATIONS

This application is based upon and claims the benefit of priority from prior Japanese Patent Application No. 2004-322710, filed Nov. 5, 2004, the entire contents of which are incorporated herein by reference.

BACKGROUND OF THE INVENTION

1. Field of the Invention

The present invention relates to a semiconductor device and a method of manufacturing the same. More specifically, the invention relates to a dynamic random access memory (DRAM) including a bit line contact having a self-align contact (SAC) structure, which is sandwiched between two gates, or a DRAM-embedded semiconductor memory device.

2. Description of the Related Art

Recently, a halo ion implantation process has been used for the manufacture of DRAMs or DRAM-embedded semiconductor memory devices (see, e.g., U.S. Pat. No. 6,444,548). In the halo ion implantation process, ion implantation (I/I) is performed at an angle. For example, impurities whose conductivity type is opposite to that of the source and drain are ion-implanted into the surface area of a substrate (DRAM cell), which corresponds to the edges of the gate (the end portions of the channel), through a contact hole for forming a bit line contact (CB) having an SAC structure to connect the substrate to the bit lines (formation of a diffusion preventing layer by CB halo I/I). The following problem can thus be circumvented. As a cell transistor decreases in gate length, the impurities that are ion-implanted to form the source and drain diffuse toward the edges of the gate to thereby lower the threshold voltage of the cell transistor.

However, a gate-to-gate space in which a bit-line contact is provided is gradually narrowed. Impurities are therefore becoming difficult to ion-implant exactly into the surface area of the substrate, which corresponds to the edges of the gate, even by the CB halo I/I.

BRIEF SUMMARY OF THE INVENTION

According to a first aspect of the present invention, there is provided a semiconductor device comprising a semiconductor substrate, at least two gate electrode sections formed adjacent to each other on a surface of the semiconductor substrate, a first diffusion region formed in a surface area of the semiconductor substrate, except in the gate electrode sections, a substrate contact layer formed between the gate electrode sections in self-alignment with the gate electrode sections, a first side-wall insulating film formed on one of side-wall portions of each of the gate electrode sections, a second side-wall insulating film formed on other of the side-wall portions of each of the gate electrode sections, and a second diffusion region whose conductivity type is opposite to that of the first diffusion region, formed in the surface area of the semiconductor substrate and corresponding to each of edges of the gate electrode sections, the edges corresponding to the other of the side-wall portions.

According to a second aspect of the present invention, there is provided a method of manufacturing a semiconductor device, comprising forming at least two gate electrode sections adjacent to each other on a surface of a semiconductor substrate, forming a first diffusion region in a surface area of the semiconductor substrate, except in the gate electrode sections, forming a first side-wall insulating film on each of side-wall portions of the gate electrode sections, forming a first interlayer insulating film on the surface of the semiconductor substrate and between the gate electrode sections, selectively removing the first interlayer insulating film to form a contact hole between the gate electrode sections in self-alignment with the gate electrode sections in order to form a substrate contact layer, removing the first side-wall insulating film that is exposed to the contact hole, ion-implanting impurities through the contact hole to form a second diffusion region whose conductivity type is opposite to that of the first diffusion region in the surface area of the semiconductor substrate, which corresponds to edges of the gate electrode sections, the edges being close to the substrate contact layer, forming a second side-wall insulating film on each of side-wall portions of the gate electrode sections, from which the first side-wall insulating film is removed, and burying a conductive material into the contact hole to form the substrate contact layer.

DETAILED DESCRIPTION OF THE INVENTION

Embodiments of the present invention will be described with reference to the accompanying drawings.

First Embodiment

Figures 1A, 1B:
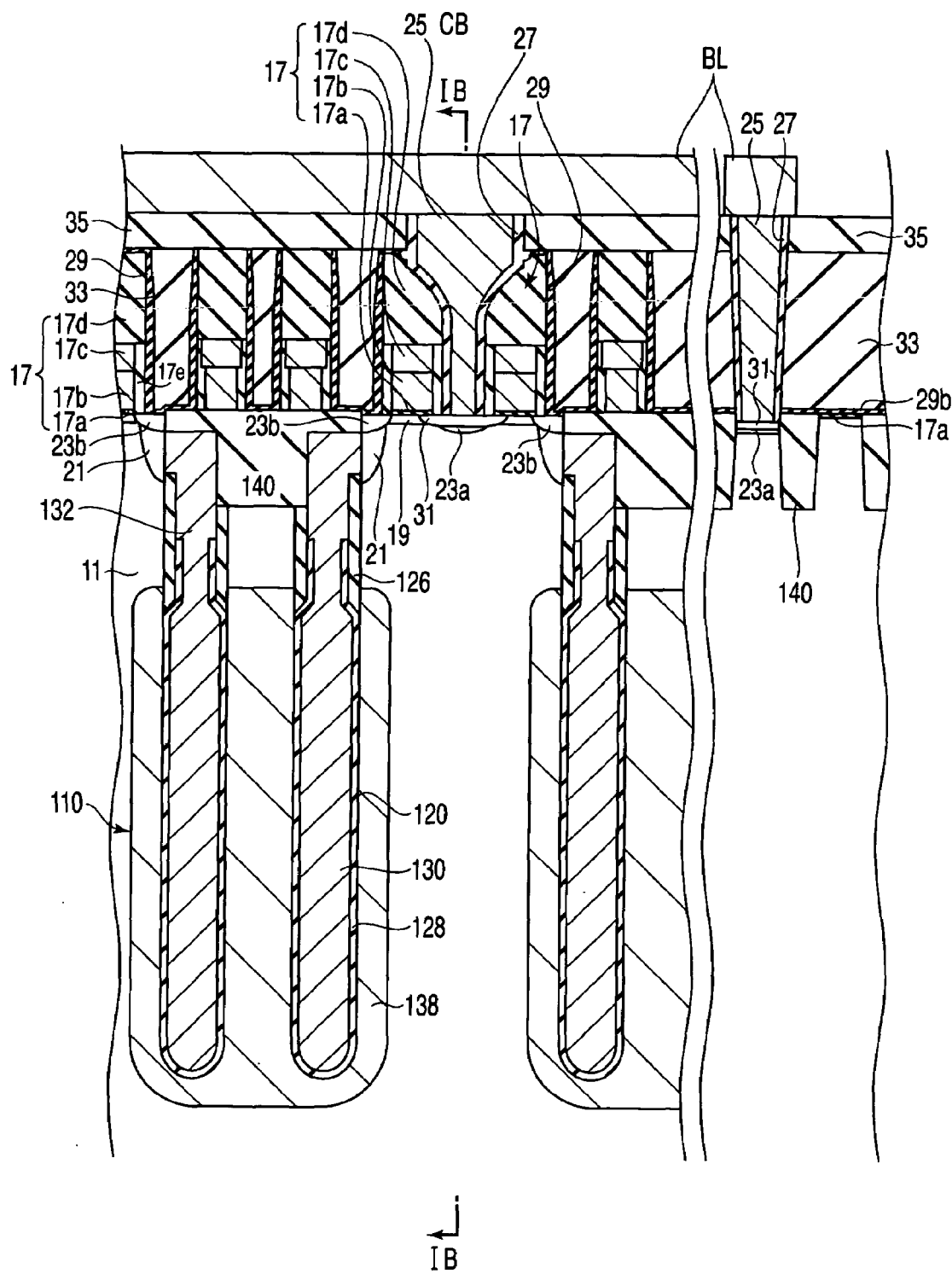
FIGS. 1A and 1B are sectional views of the principal part of a DRAM according to a first embodiment of the present invention.

FIGS. 1A and 1B show a DRAM according to a first embodiment of the present invention. In the first embodiment, the DRAM has a trench cell structure. FIG. 1A is a sectional view of the principal part (DRAM cell) of the DRAM and FIG. 1B is a sectional view taken along line IB—IB of FIG. 1A.

Referring to FIGS. 1A and 1B, a plurality of trench capacitors (deep trenches) 110 are formed in the surface area (p-type well region) of a semiconductor substrate 11 that is made of silicon (Si). The trench capacitors 110 make up their respective cell capacitors of the DRAM cell. Each of the trench capacitors 110 includes a plate electrode 138, a pair of capacitive insulating films 128, a pair of node electrodes 130 and a pair of trenches 120. The plate electrode 138 is formed on the peripheries of the trenches 120, except on the upper portions of the trenches. The capacitive insulating films 128 are high-dielectric insulating films formed on the inner walls of the trenches 120. The trenches 120 in which the capacitive insulating films 128 are formed are filled with the node electrodes 130, respectively. The node electrodes 130 contain high-concentration n-type impurities such as phosphorus (P). The plate electrode 138 is formed by diffusing the n-type impurities from the node electrodes 130 into the semiconductor substrate 11 through the capacitive insulating films 128.

A color oxide film 126 is formed on the upper inner wall of each of the trenches 120 in order to prevent the impurities from diffusing in the corresponding node electrode 130.

A silicon (Si) film 132 is provided above each of the trenches 120 to communicate with the corresponding node electrode 130. An element isolating region 140 having a shallow trench isolation (STI) structure is formed in the upper portion of each trench capacitor 110 and between the trenches 120 in the capacitor 110.

Switching transistors (cell transistors of the DRAM cell) are formed in the surface area of the semiconductor substrate 11, except where the trench capacitors 110 are formed. In other words, two gate electrode sections (GC) 17 and 17 are provided adjacent to each other on the surface of the semiconductor substrate 11 and between the trench capacitors 110. The gate-to-gate space between the gate electrode sections 17 and 17 is narrow and set at, e.g., about 70 nm. Each of the gate electrode sections 17 and 17 is made up of a gate oxide film 17a, an electrode layer (e.g., polysilicon film) 17b, a silicide layer (e.g., tungsten silicide film (WSi film)) 17c and a cap layer (e.g., silicon nitride film (SiN film)) 17d, which are formed one on another in the order designated. A side-wall oxide film (silicon oxide film ($SiO_2$ film)) 17e is provided on the side-wall portions of the gate oxide film 17a, electrode layer 17b and silicide layer 17c.

In the surface area of the semiconductor substrate 11, p-type channel sections 19 and 19 are formed to correspond to the gate electrode sections 17 and 17, respectively. N-type diffusion regions 21 and 21 are each formed in the surface area of the semiconductor substrate 11 and between one of the trench capacitors 110 and its corresponding gate electrode section 17. The Si films 132 of the trench capacitors 110 are connected to diffusion regions 21 and 21, respectively. N-type diffusion layers (first diffusion regions) 23a and 23b, which serve as a source and a drain, are each provided in the surface area of the semiconductor substrate 11. The diffusion layer 23a is formed between adjacent trench capacitors 110. The diffusion layer 23b is formed between each of the gate electrode sections 17 and 17 and its corresponding diffusion region 21.

A bit line contact (CB) 25 having an SAC structure, which serves as a substrate contact layer, is formed between the gate electrode sections 17 and 17 in order to connect the semiconductor substrate (DRAM cell) 11 with a bit line BL through the diffusion layer 23a serving as a drain. A second side-wall insulating film 27 of, e.g., a $SiO_2$ film is formed on one of the side-wall portions of each of the gate electrode sections 17 and 17, which is close to the CB 25. The second side-wall insulating film 27 extends along the CB 25 to the portion above the cap layer 17d. A first side-wall insulating film (spacer) 29 of, e.g., a SiN film is formed on the other side-wall portion of each of the gate electrode sections 17 and 17, which is far from the CB 25. The first side-wall insulating film 29 is a multilayer of a spacer SiN film 29a and a barrier SiN film 29b. The height of each of the gate electrode sections 17 and 17 including the first side-wall insulating film 29 is about 300 nm.

A p-type diffusion preventing layer (second diffusion region) 31 whose conductivity type is opposite to that of the above diffusion layer 23a is formed by CB halo I/I in the surface area of the semiconductor substrate 11, which corresponds to at least the edges of the gate electrode sections 17 and 17, which are close to the CB 25. The diffusion preventing layer 31 is increased in concentration more than the channel sections 19 and 19. The impurities that are ion-implanted to form the diffusion layer 23a can thus be prevented from diffusing toward the edges of the gate electrode sections 17 and 17 (ends of the channel sections 19 and 19). As will be described later, the diffusion preventing layer 31 is formed while the spacer (first side-wall insulating film 29) peels off the side-wall portion of each of the gate electrode sections 17 and 17, which is close to the CB 25.

A first interlayer film (e.g., a $SiO_2$ film or a boron-doped phospho-silicate glass (BPSG) film) 33 is buried in the surface area of the semiconductor substrate 11, except in the gate electrode sections 17 and 17, through the barrier SiN film 29b. The bit line BL is formed on a second interlayer film (e.g., a $SiO_2$ film or a tetra ethoxy silane (TEOS) film) 35 to communicate with the CB 25. The second interlayer film 35 is formed on the entire surface of the semiconductor substrate 11 including the first interlayer film 33.

With the above configuration, the diffusion preventing layer 31 can prevent the impurities that are ion-implanted to form the diffusion layer 23a from diffusing toward the edges of the gate electrode sections 17 and 17.

In the first embodiment, the diffusion preventing layer 31 is formed by CB halo I/I while the spacer (first side-wall insulating film 29) peels off the side-wall portion of each of the gate electrode sections 17 and 17. The gate-to-gate space between the gate electrode sections 17 and 17 increases more than conventional. The impurities can thus be ion-implanted exactly into the surface area of the semiconductor substrate 11 corresponding to at least the edges of the gate electrode sections 17 and 17, which are close to the CB 25. Even though the gate length of the gate electrode sections 17 and 17 is shortened, the problem that the cell transistors decrease in the threshold voltage (characteristic) can be circumvented.

According to the above configuration, the second side-wall insulating film 27 of a SiO$_2$ film whose dielectric constant is lower than that of the SiN film (first side-wall insulating film 29) is formed again on the side-wall portion of each of the gate electrode sections 17 and 17, which is close to the CB 25. The CB-to-gate capacity (bit line capacity) can thus be reduced more than when the SiN film is used. The signal transmission speed can be improved and so can be the data read margin.

The advantage of the diffusion preventing layer 31 formed by CB halo I/I will be described further. In the DRAM, a junction leak needs to reduce by decreasing the field intensity at a junction on either side of the trench capacitor 110 (close to a junction between a channel section 19 and its corresponding diffusion region 21) in order to lengthen a pause time. To do so, it is effective to decrease the dose of impurities that are ion-implanted into the channel section 19. If, however, the dose of impurities is simply decreased, the diffusion layer 23a greatly expands from the CB 25 to increase the off-leak of the cell transistors. In other words, a junction leak on either side of the trench capacitor 110 has to reduce by decreasing the dose of impurities that are ion-implanted into the channel section 19 without increasing the off-leak of the cell transistors.

The diffusion layer 23a that is close to the CB 25 is extended by decreasing the dose of impurities that are ion-implanted into the channel section 19. This extension of the layer 23a is canceled by forming the diffusion preventing layer 31 by CB halo I/I.

Figure 2:
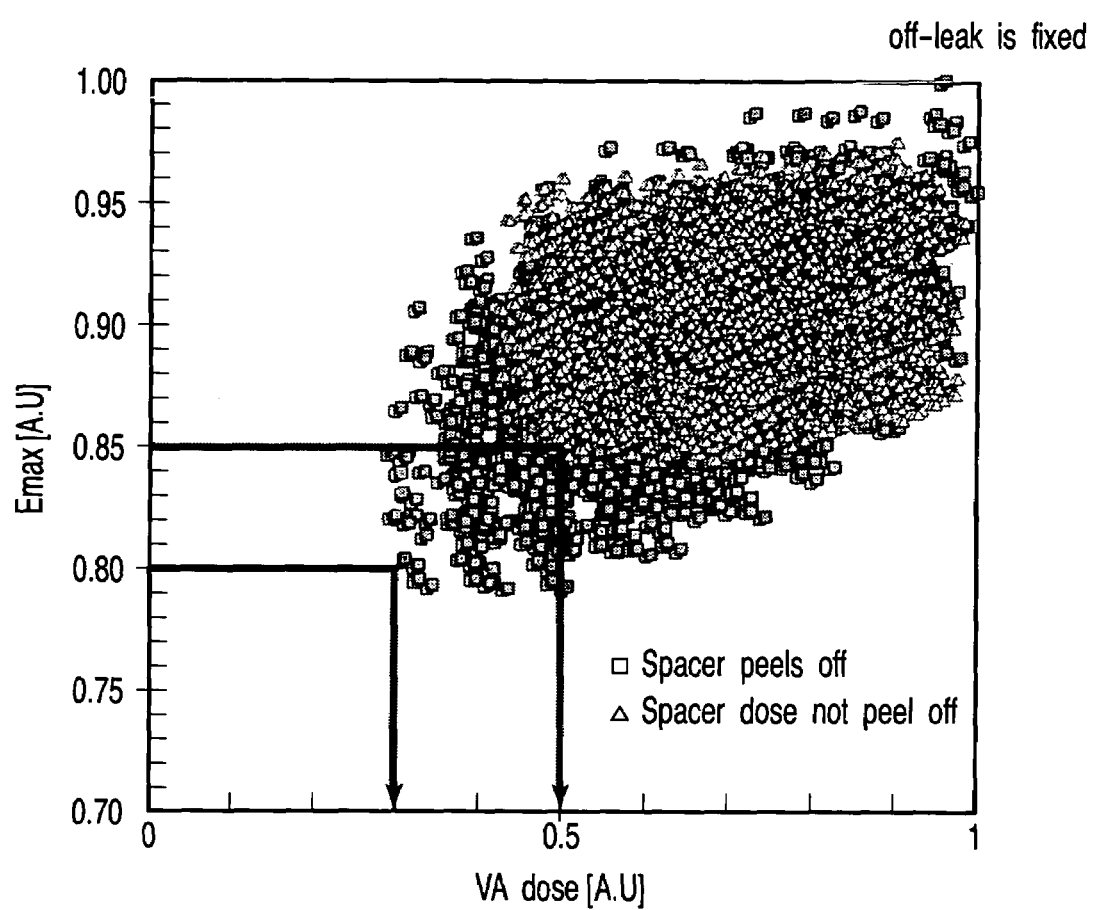
FIG. 2 is a distribution map of results of simulations performed when a diffusion preventing layer is formed by CB halo I/I in both cases where a spacer peels off and it does not peel off.

FIG. 2 shows results of simulations performed when a diffusion preventing layer is formed by CB halo I/I in both cases where a spacer (first side-wall insulating film) peels off and it does not peel off.

As is apparent from FIG. 2, if the off-leak of the cell transistors is fixed, the advantage of reducing the dose of impurities that are ion-implanted into the channel sections 19 and 19 is greater in the case where the spacer peels off. When the spacer peels off, impurities whose conductivity type is opposite to that of the diffusion layer 23a can be ion-implanted exactly into the surface area of the semiconductor substrate 11 corresponding to at least the edges of the gate electrode sections 17 and 17, which are close to the CB 25. It is thus possible to cancel the extension of the diffusion layer 23a and vary the position of the junction. Consequently, the dose of impurities that are ion-implanted into the channel sections can be decreased, as can be the field intensity.

In the prior art case where the spacer does not peel off, the diffusion preventing layer 31 is formed under the spacer and close to the surface area of the semiconductor substrate 11. The off-leak of cell transistors increases more than that in the first embodiment of the present invention. Consequently, the dose of impurities that are ion-implanted into the channel sections cannot be decreased, nor can be the field intensity adequately.

A method of manufacturing the above-described DRAM will be described. First, a plurality of trench capacitors 110 are formed in the surface area of a semiconductor substrate 110. The trench capacitors 110 are formed through the following process. A first silicon nitride (SiN) film, not shown, is deposited in the surface area of the semiconductor substrate 11. A pattern of trenches 120 for the capacitors is formed in the first SiN film by lithography and etching. The trenches 120 are formed to a desired depth in the surface area of the semiconductor substrate 11 by anisotropic dry etching (RIE: reactive ion etching) using the first SiN film as a mask.

A thin, first Si film (not shown) is deposited on the entire inner surface of each of the trenches 120, and a second SiN film (not shown) is deposited. A resist (not shown) is formed only in the lower portion of each of the trenches 120 to expose the second SiN film. The exposed second SiN film is selectively removed by etching such as wet etching and isotropic dry etching. The resist is removed from each of the trenches 120. The semiconductor substrate 11 and the first Si film are oxidized by local oxidation of silicon (LOCOS) using the second SiN film as a mask to form a LOCOS oxide film (color oxide film) 126 in the upper portion of each of the trenches 120 and on the first SiN film. After that, the second SiN film is removed. Thus, the color oxide films 126 are formed in the upper portion of each of the trenches 120.

The first Si film is removed to expose the semiconductor substrate 11 in the lower portion of each of the trenches 120. The inside surface of each of the trenches 120 is cleaned and at the same time a very thin silicon oxide film (SiO$_2$ film), not shown, is formed. The very thin SiO$_2$ film is nitrided in an ammonium (NH$_3$) atmosphere. After that, an aluminum oxide film (Al$_2$O$_3$ film) is deposited as a high-dielectric insulating film serving as a capacitive insulating film 128 to a thickness of 5 nanometers (nm) on the entire inner surface of each of the trenches 120 by, e.g., atomic layer deposition (ALD). The resultant structure is annealed to densify the Al$_2$O$_3$ film.

For example, a film that is formed by adding nitrogen or carbon to an Al$_2$O$_3$ film and a mixed film of an Al$_2$O$_3$ film and a hafnium oxide film (Hf$_2$O$_3$ film) whose dielectric constant is higher than that of the Al$_2$O$_3$ film can be used as the capacitive insulating film 128.

A node electrode 130 is formed in each of the trenches 120 and the impurities of the node electrode 130 are diffused into the semiconductor substrate 11 to form a plate electrode 138 therein. The node electrode 130 is formed as follows. An amorphous, second silicon film (a-Si film), not shown, which is doped with n-type impurities such as phosphorus in high concentrations, is deposited to fill each of the trenches 120 by low pressure chemical vapor deposition (LPCVD). Appropriately, the phosphorus concentration of the second a-Si film is $5 \times 10^{19}$ atoms/cm$^3$ or higher, preferably $1 \times 10^{20}$ atoms/cm$^3$ or higher.

The resultant structure is annealed at, e.g., 1000° C. or higher to cause phosphorus to pass through the capacitive insulating film 128 from the node electrode 130 and diffuse the phosphorus into the semiconductor substrate 11. The plate electrode 138 is thus formed on the periphery of each of the trenches 120. Since the atomic radius of the phosphorus is short, it passes between lattices of the Al$_2$O$_3$ film. With the annealing, the second a-Si film of the node electrode 130 is changed into a polysilicon film. The annealing for diffusing the phosphorus can be performed together with the annealing in a step not immediately after the second a-Si film is deposited but after cell transistors are formed.

The second a-Si film is removed from near the opening of each of the trenches 120 by, e.g., isotropic dry etching. The capacitive insulating film 128 that is exposed to the upper portion of each of the trenches 120 is removed by, e.g. thermal phosphoric acid. After that, the color oxide film 126 is removed from the upper portion of each of the trenches 120 by, e.g., anisotropic dry etching. A Si film (third silicon film) 132, which is doped with phosphorus in high concentrations, is deposited on the entire surface to obtain the trench capacitors 110 shown in FIGS. 1A and 1B.

When the formation of the trench capacitors 110 is completed, an element isolating region 140 is formed. Diffusion layers serving as a p-type well region and channel sections 19 and 19 are formed in the surface area of the semiconductor substrate 11, except in the element isolating region 140.

Figures 3A, 3B:
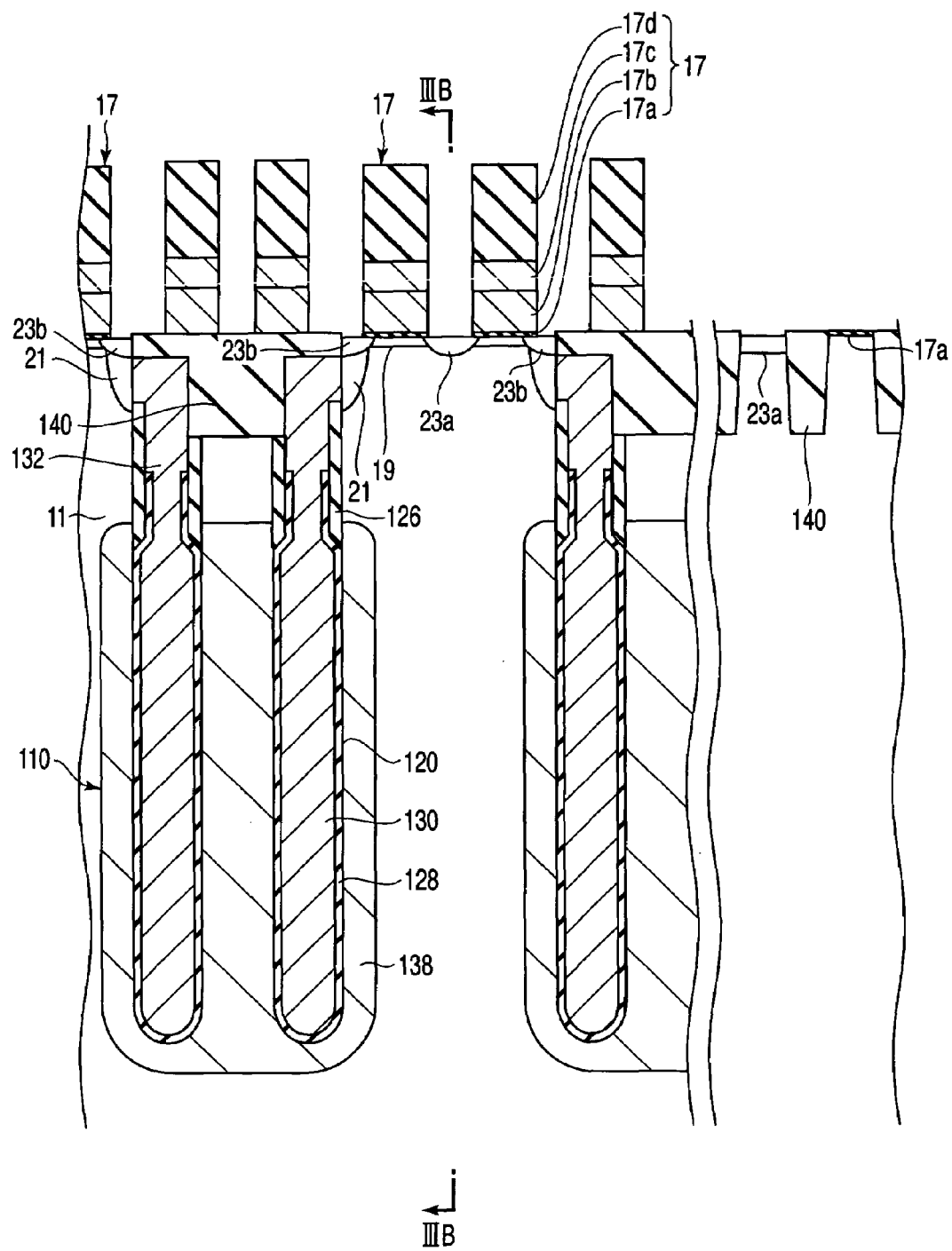
FIGS. 3A and 3B are process sectional views illustrating a method of manufacturing the DRAM shown in FIGS. 1A and 1B.

On the surface of the semiconductor substrate 11, a gate oxide film 17a, an electrode layer 17b, a silicide layer 17c and a cap layer 17d are formed one on another in the order designated and patterned to form gate electrode sections 17 and 17. N-type diffusion regions 21 and 21 are each formed in the surface area of the semiconductor substrate 11 and between the trench capacitor 110 and its corresponding gate electrode section 17. N-type diffusion layers 23a and 23b serving as a source and a drain are formed in the surface area of the semiconductor substrate 11. The layer 23a is formed between the gate electrode sections 17 and 17. The layer 23b is formed between the trench capacitor 110 and its corresponding gate electrode section 17. (see FIG. 3A and FIG. 3B taken along line IIIB—IIIB of FIG. 3A).

Figures 4A, 4B:
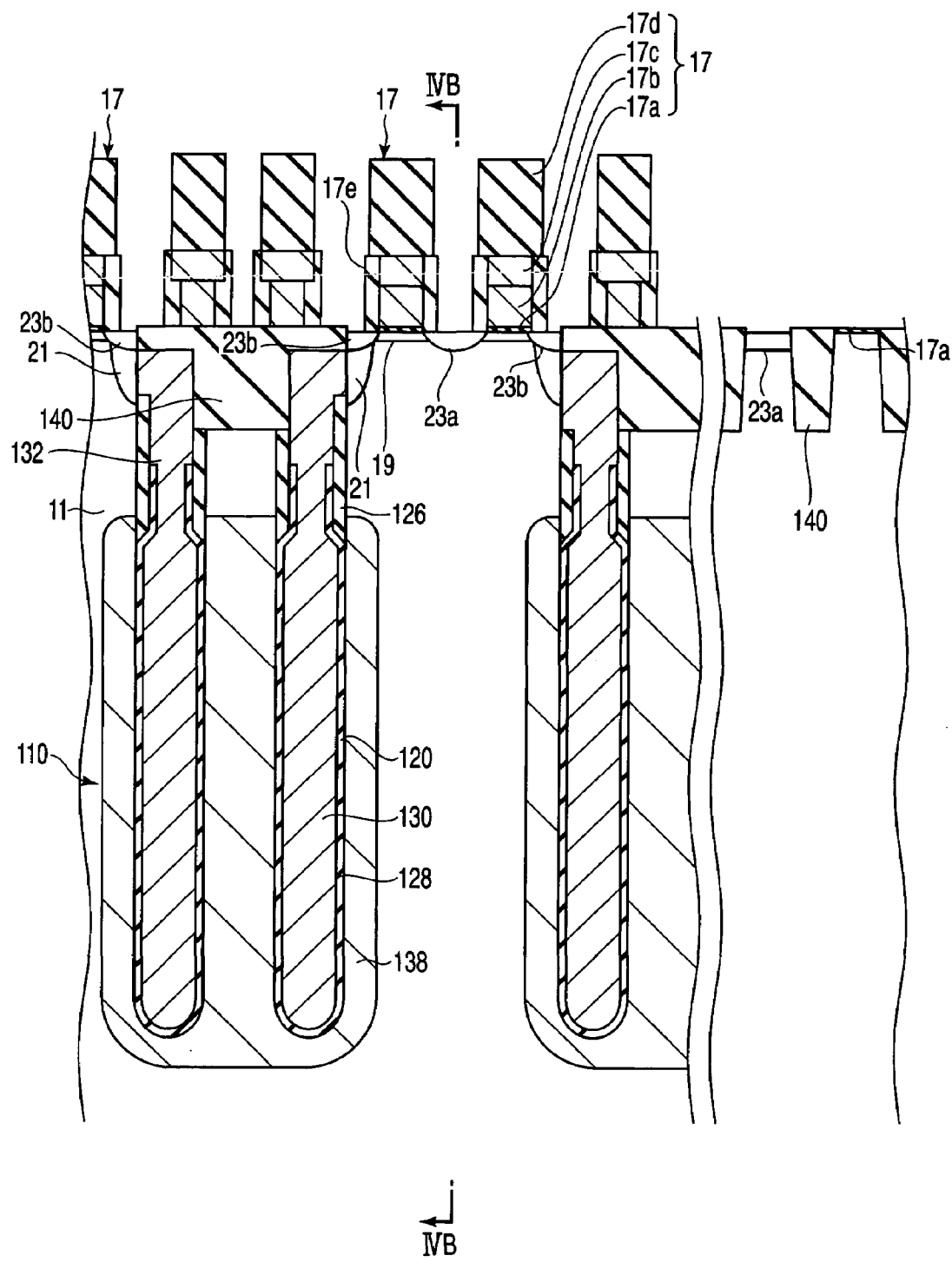
FIGS. 4A and 4B are process sectional views illustrating a method of manufacturing the DRAM shown in FIGS. 1A and 1B.

The side-walls of the gate oxide film 17a, electrode layer 17b and silicide layer 17c are oxidized to form a side-wall oxide film 17e thereon (see FIG. 4A and FIG. 4B taken along line IVB—IVB of FIG. 4A).

Figures 5A, 5B:
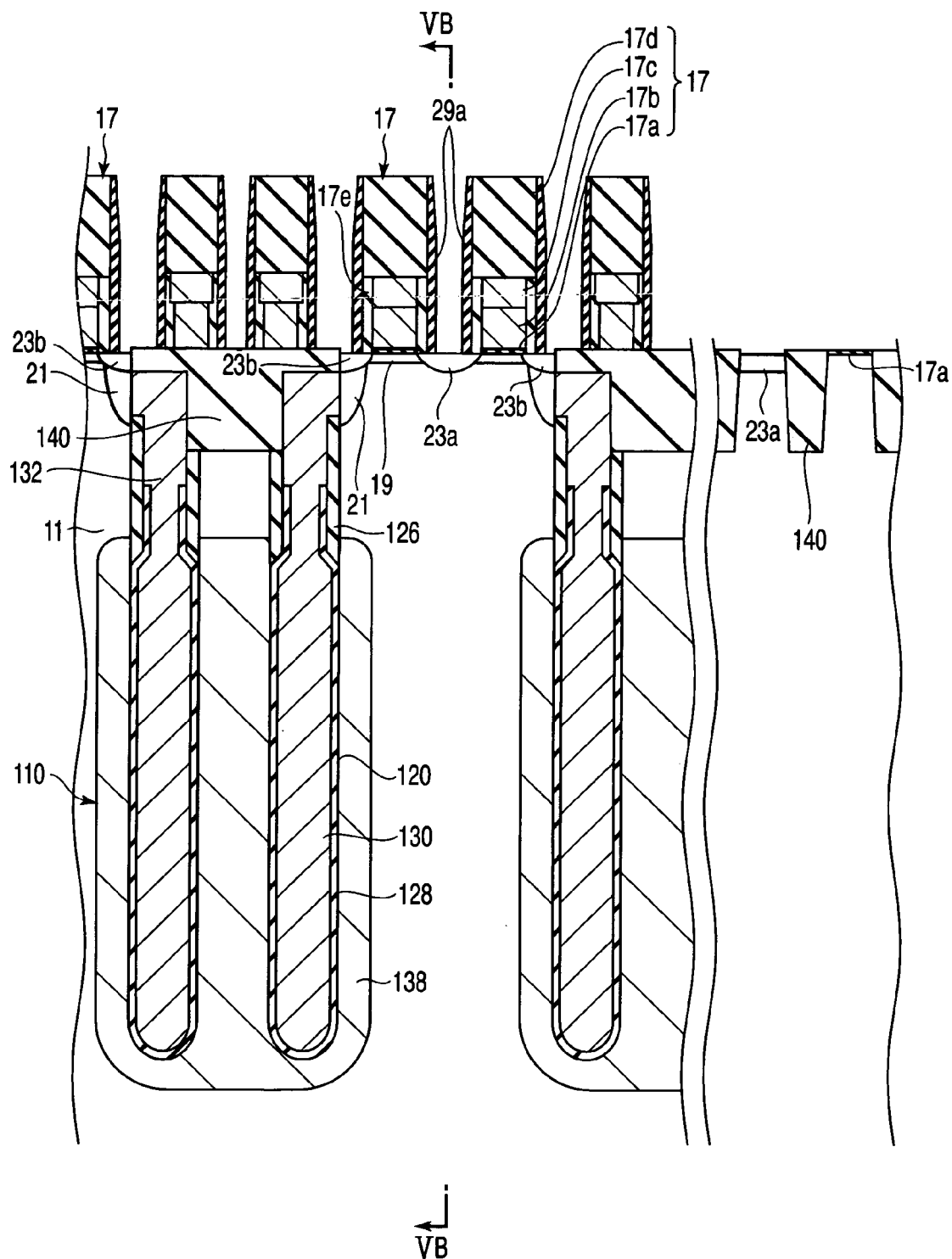
FIGS. 5A and 5B are process sectional views illustrating a method of manufacturing the DRAM shown in FIGS. 1A and 1B.

A spacer SiN film 29a is formed to a thickness of about 15 nm on each of the side-walls of the gate electrode sections 17 and 17 on which the side-wall oxide film 17e is formed (see FIG. 5A and FIG. 5B taken along line VB—VB of FIG. 5A).

Figures 6A, 6B:
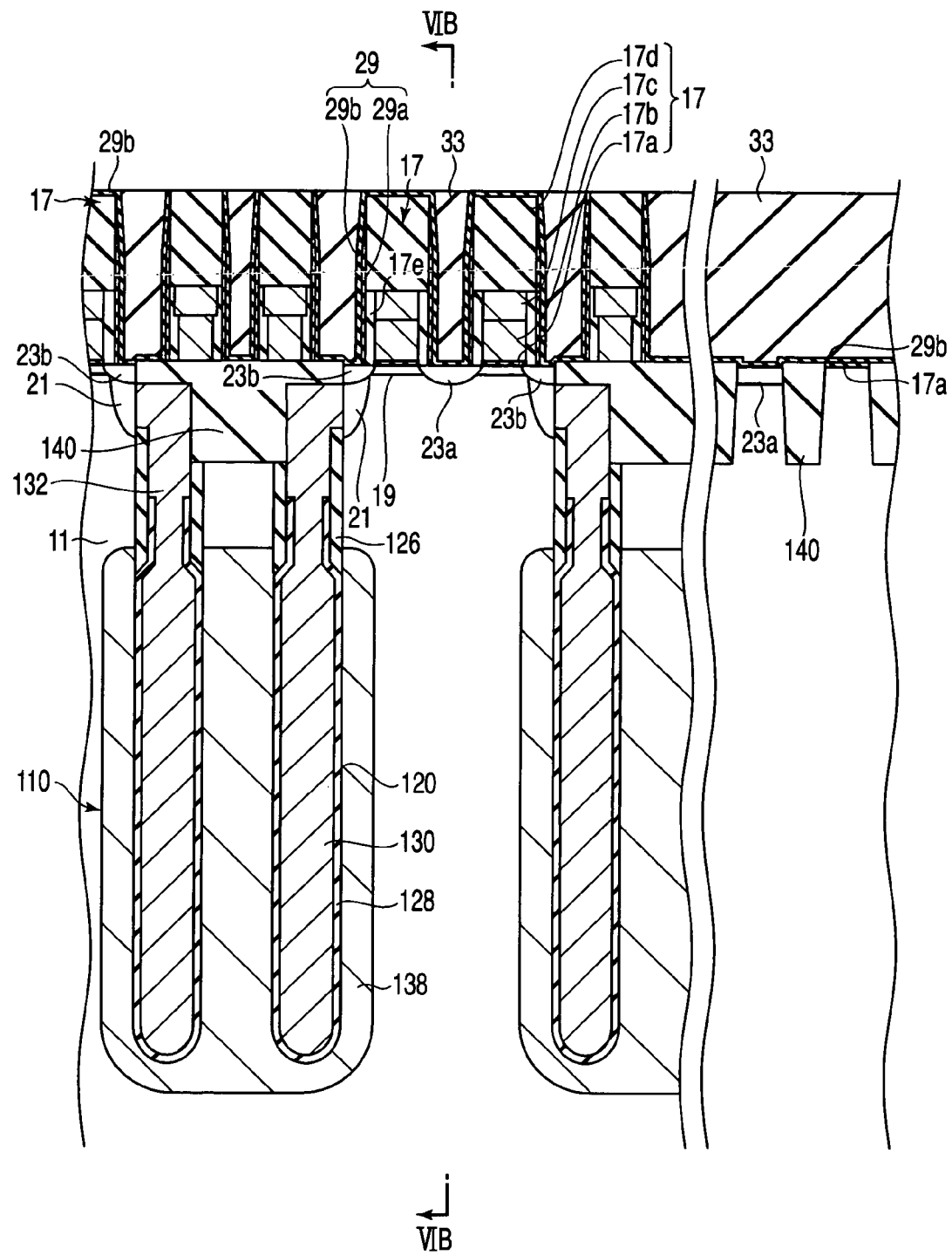
FIGS. 6A and 6B are process sectional views illustrating a method of manufacturing the DRAM shown in FIGS. 1A and 1B.

A barrier SiN film 29b is deposited to a thickness of about 8 nm on the entire surface of the resultant structure to form a first side-wall insulating film (spacer) 29 on each of the side-walls of the gate electrode sections 17 and 17. The spacer 29 is a multilayer of the spacer SiN film 29a and barrier SiN film 29b. A first interlayer film 33 is buried into the entire surface of the structure with the barrier SiN film 29b therebetween. The top of the first interlayer film 33 is flattened by chemical mechanical polishing (CMP) using the cap layer 17d as a stopper (see FIG. 6A and FIG. 6B taken along line VIB—VIB of FIG. 6A).

Figures 7A, 7B:
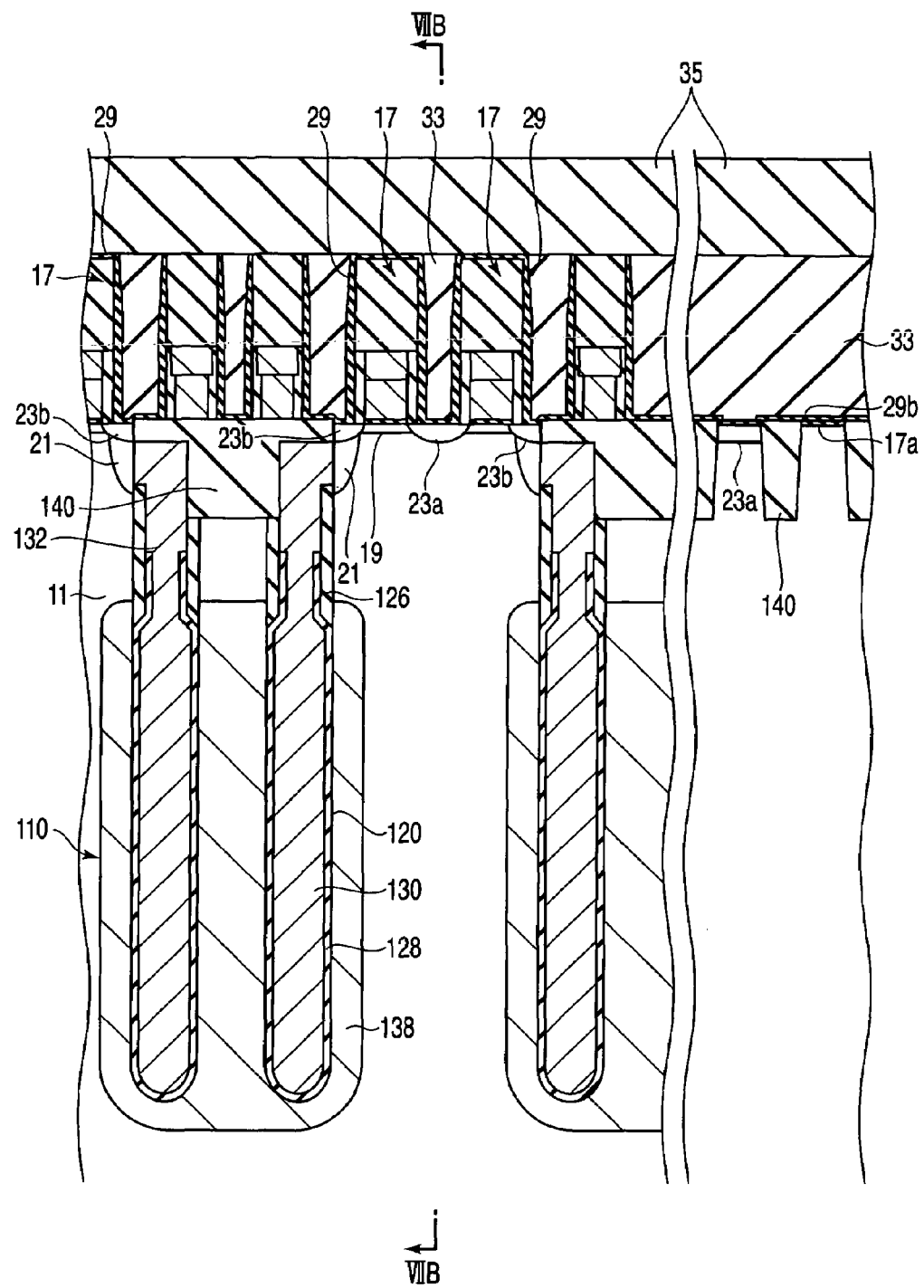
FIGS. 7A and 7B are process sectional views illustrating a method of manufacturing the DRAM shown

A second interlayer film 35 is formed to a thickness of about 200 nm on the entire top surface of the first interlayer film 33 by CVD (see FIG. 7A and FIG. 7B taken along line VIIB—VIIB of FIG. 7A).

Figures 8A, 8B:
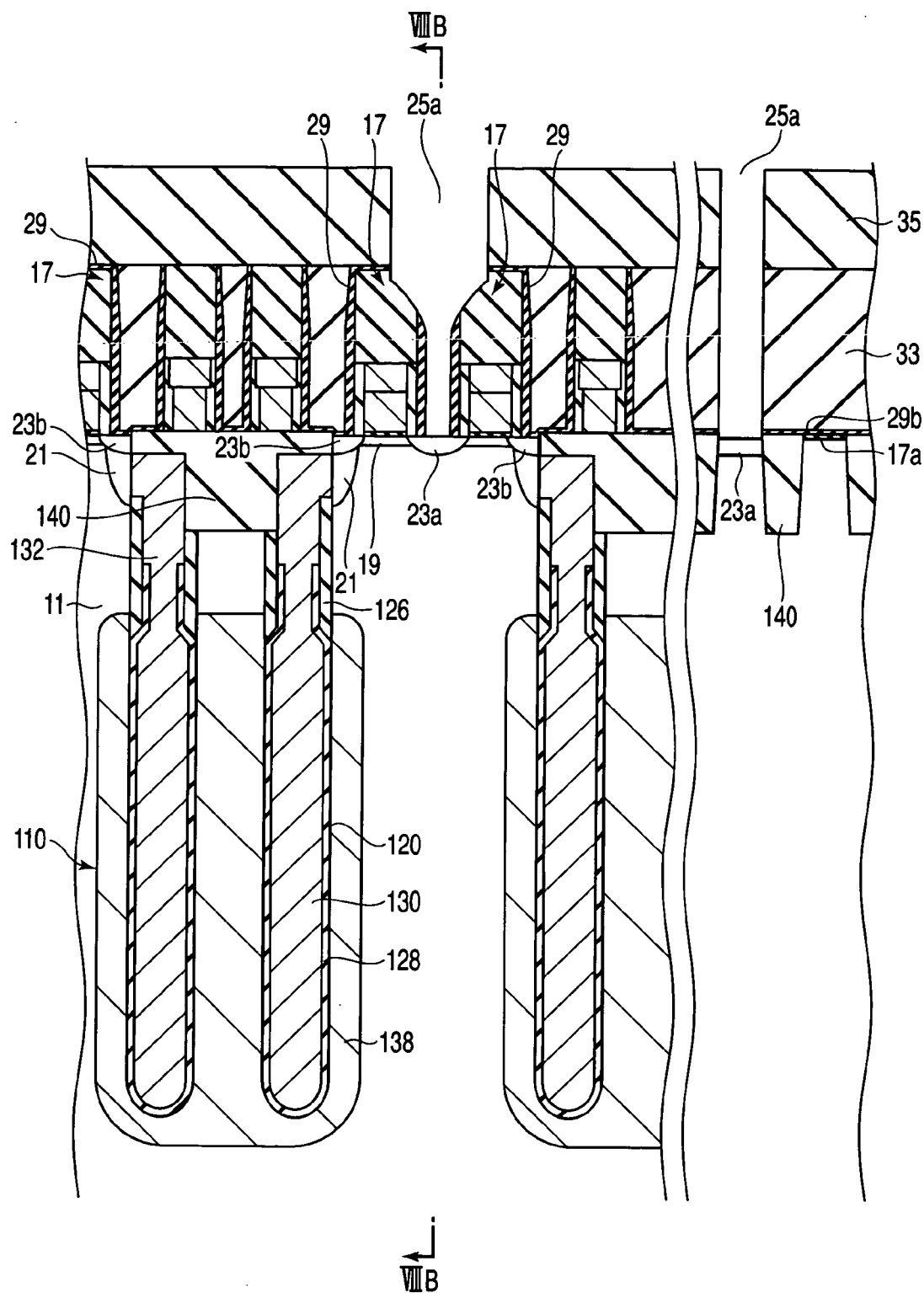
FIGS. 8A and 8B are process sectional views illustrating a method of manufacturing the DRAM shown in FIGS. 1A and 1B.

A contact hole 25a for forming a CB 25 is formed between the gate electrode sections 17 and 17 in self-alignment therewith by lithography and dry etching (see FIG. 8A and FIG. 8B taken along line VIIIB—VIIIB).

Figures 9A, 9B:
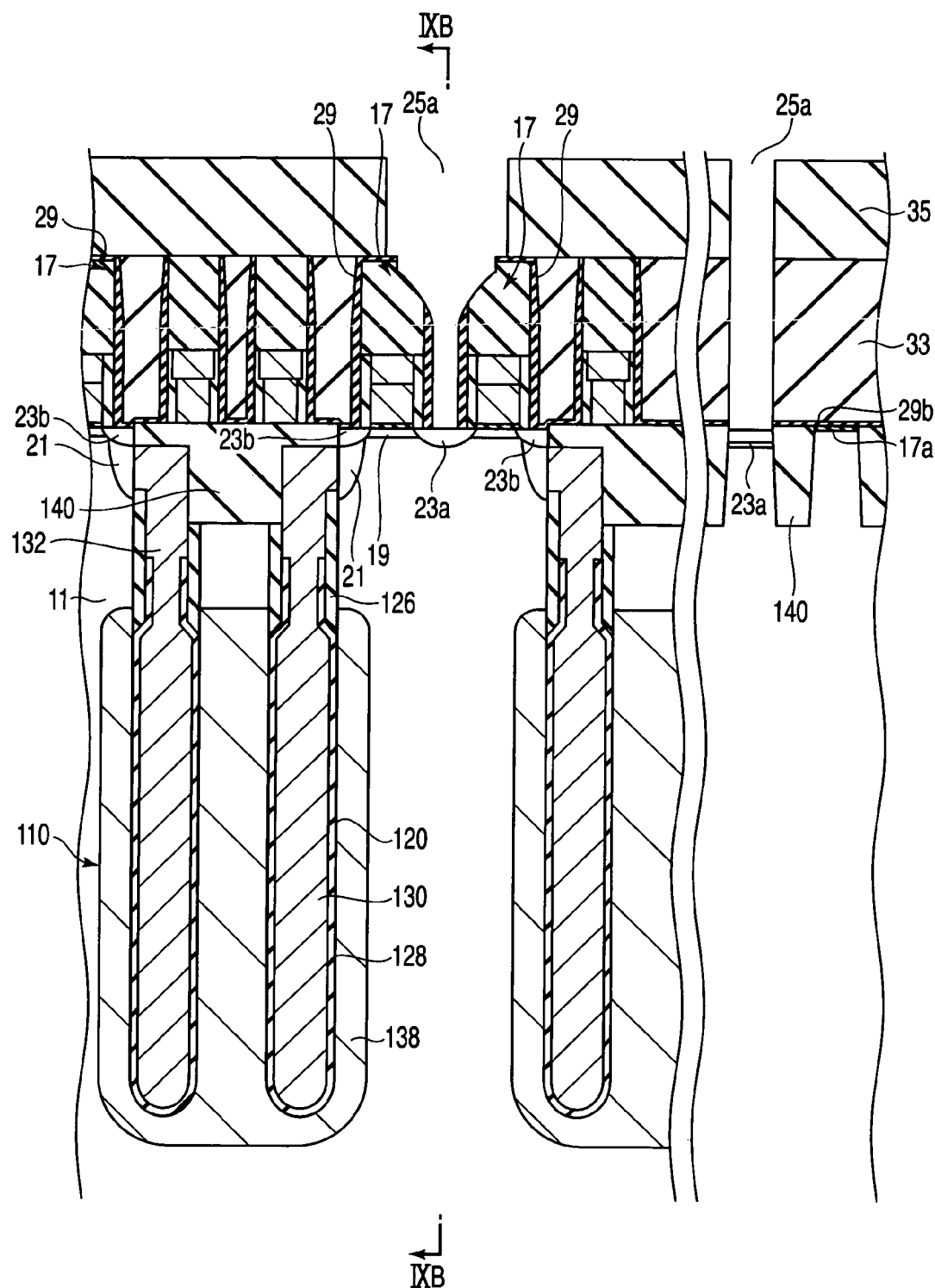
FIGS. 9A and 9B are process sectional views illustrating a method of manufacturing the DRAM shown in FIGS. 1A and 1B.

The second interlayer film 35 is removed by a pullback to expand the upper portion of the contact hole 25a (see FIG. 9A and FIG. 9B taken along line IXB—IXB of FIG. 9A).

Figures 10A, 10B:
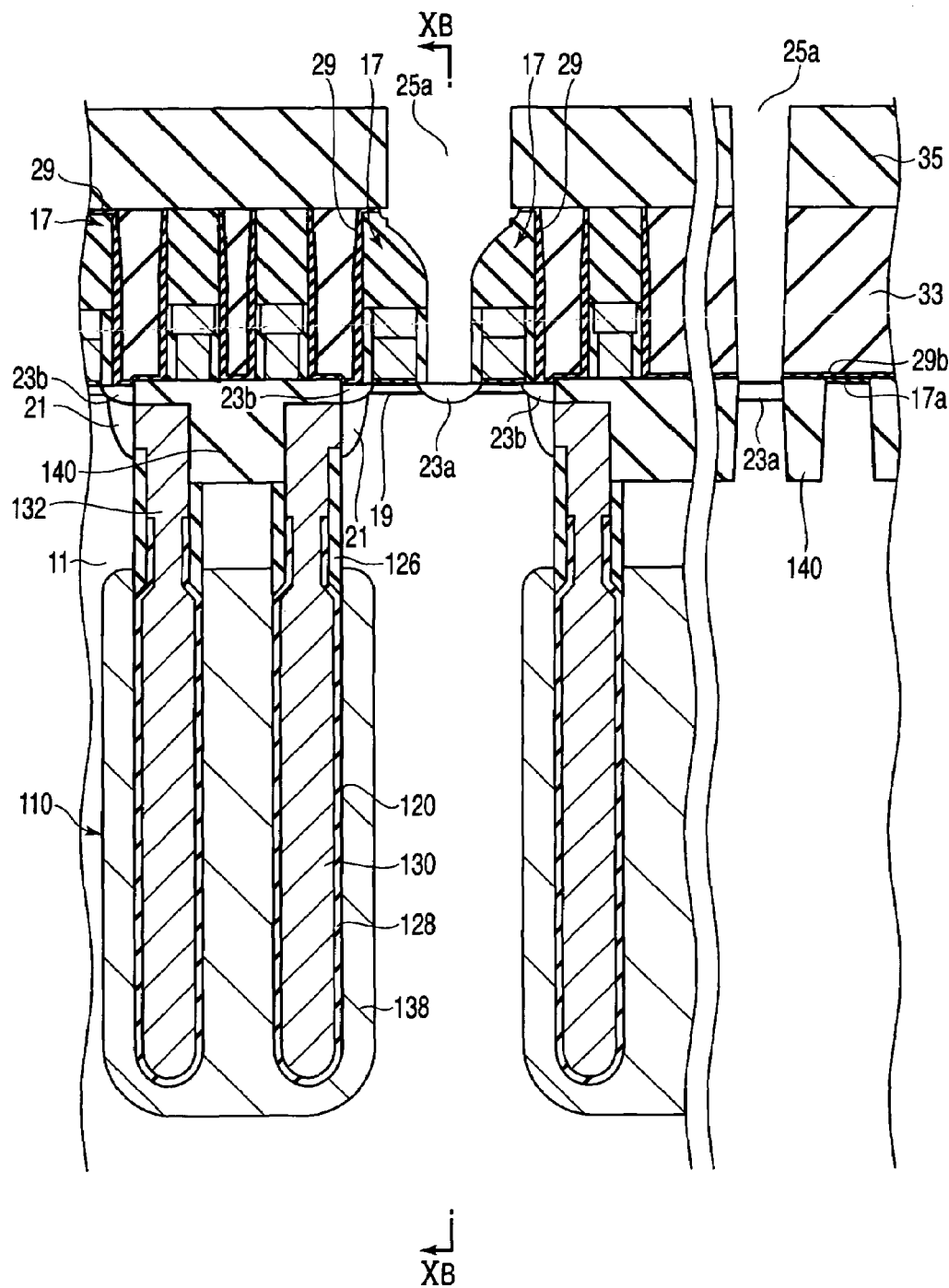
FIGS. 10A and 10B are process sectional views illustrating a method of manufacturing the DRAM shown in FIGS. 1A and 1B.

The first side-wall insulating film (spacer) 29 that is exposed to the contact hole 25a peels off (see FIG. 10A and FIG. 10B taken along line XB—XB of FIG. 10A).

Figures 11A, 11B:
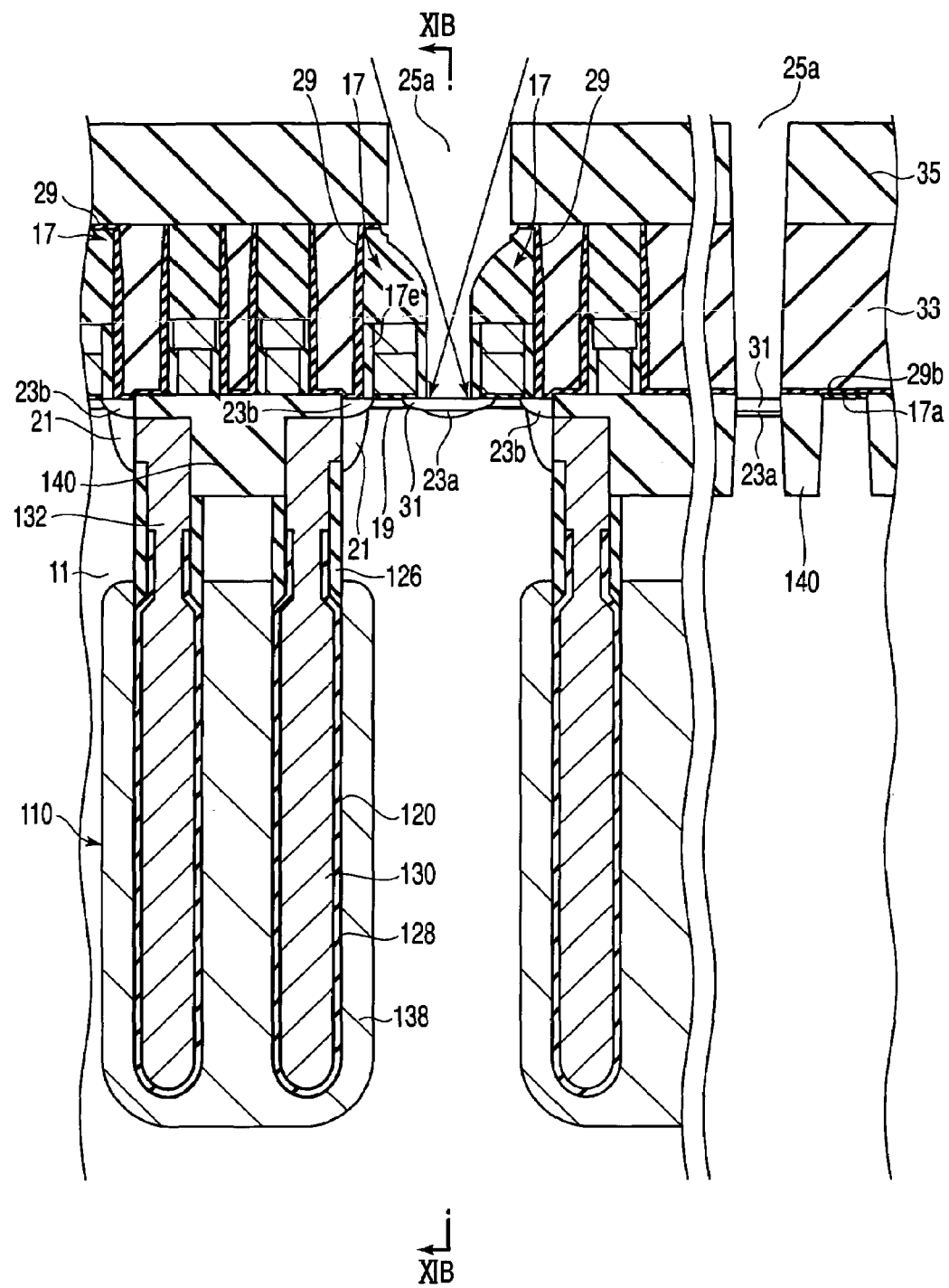
FIGS. 11A and 11B are process sectional views illustrating a method of manufacturing the DRAM shown in FIGS. 1A and 1B.

P-type impurities (e.g. boron) are ion-implanted into the surface area of the semiconductor substrate 11, which is exposed to the contact hole 25a, by CB halo I/I (indicated by the arrow) using the second interlayer film 35 as a mask. A diffusion preventing layer 31 can thus be formed in the surface area of the semiconductor substrate 11 corresponding to at least the edges of the gate electrode sections 17 and 17, which are close to the CB 25 (see FIG. 11A and FIG. 11B taken along line XIB—XIB of FIG. 11A). The conductivity type of the layer 31 is opposite to that of the diffusion layer 23a and the concentration thereof is higher than that of the channel sections 19 and 19.

Figures 12A, 12B:
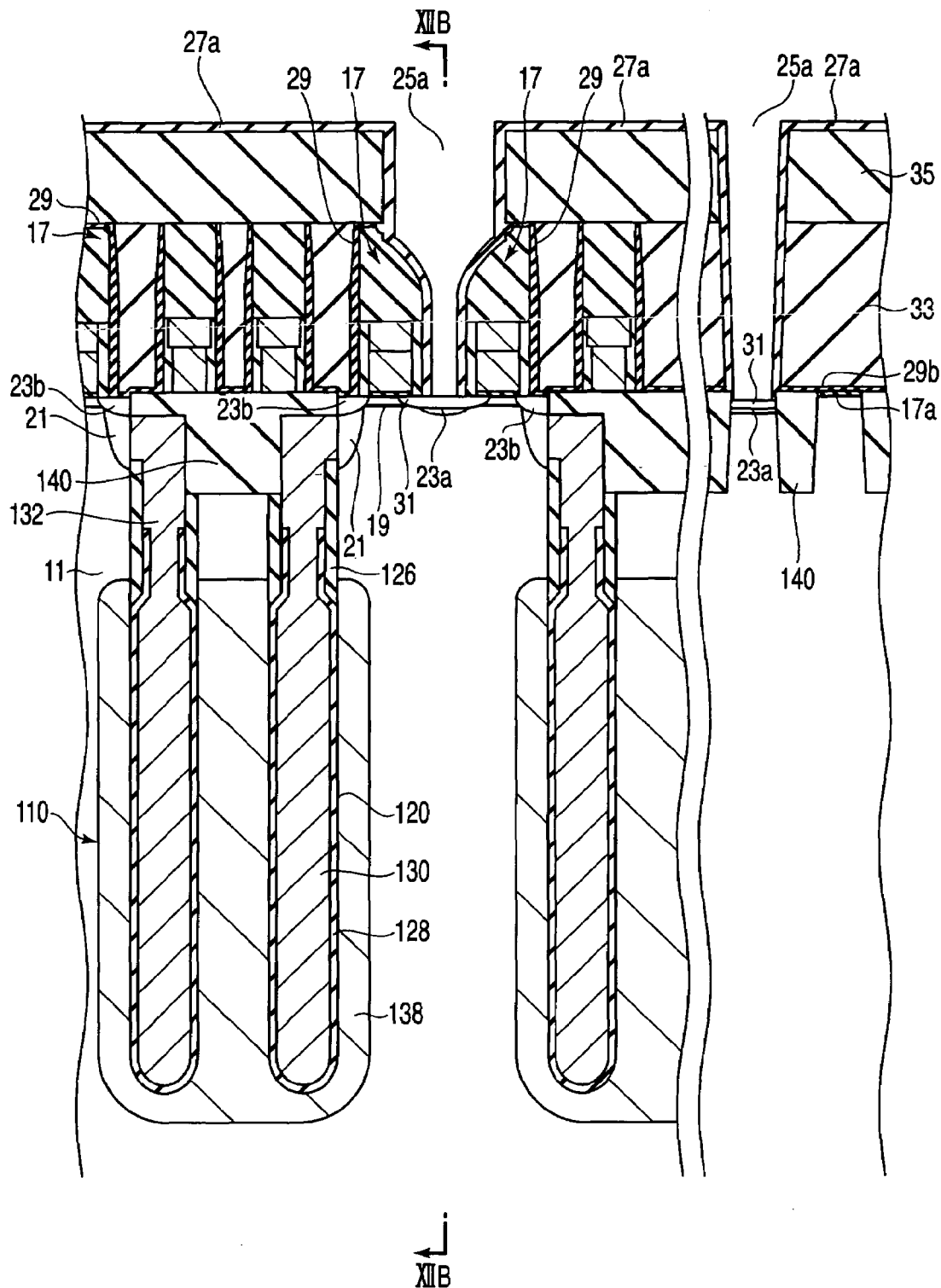
FIGS. 12A and 12B are process sectional views illustrating a method of manufacturing the DRAM shown in FIGS. 1A and 1B.

A SiO₂ film 27a is formed on the entire surface of the semiconductor substrate 11 by, e.g., CVD. The SiO₂ film 27a is etched back and removed from the bottom of the contact hole 25a (see FIG. 12A and FIG. 12B taken along line XIIB—XIIB of FIG. 12A).

Figures 13A, 13B:
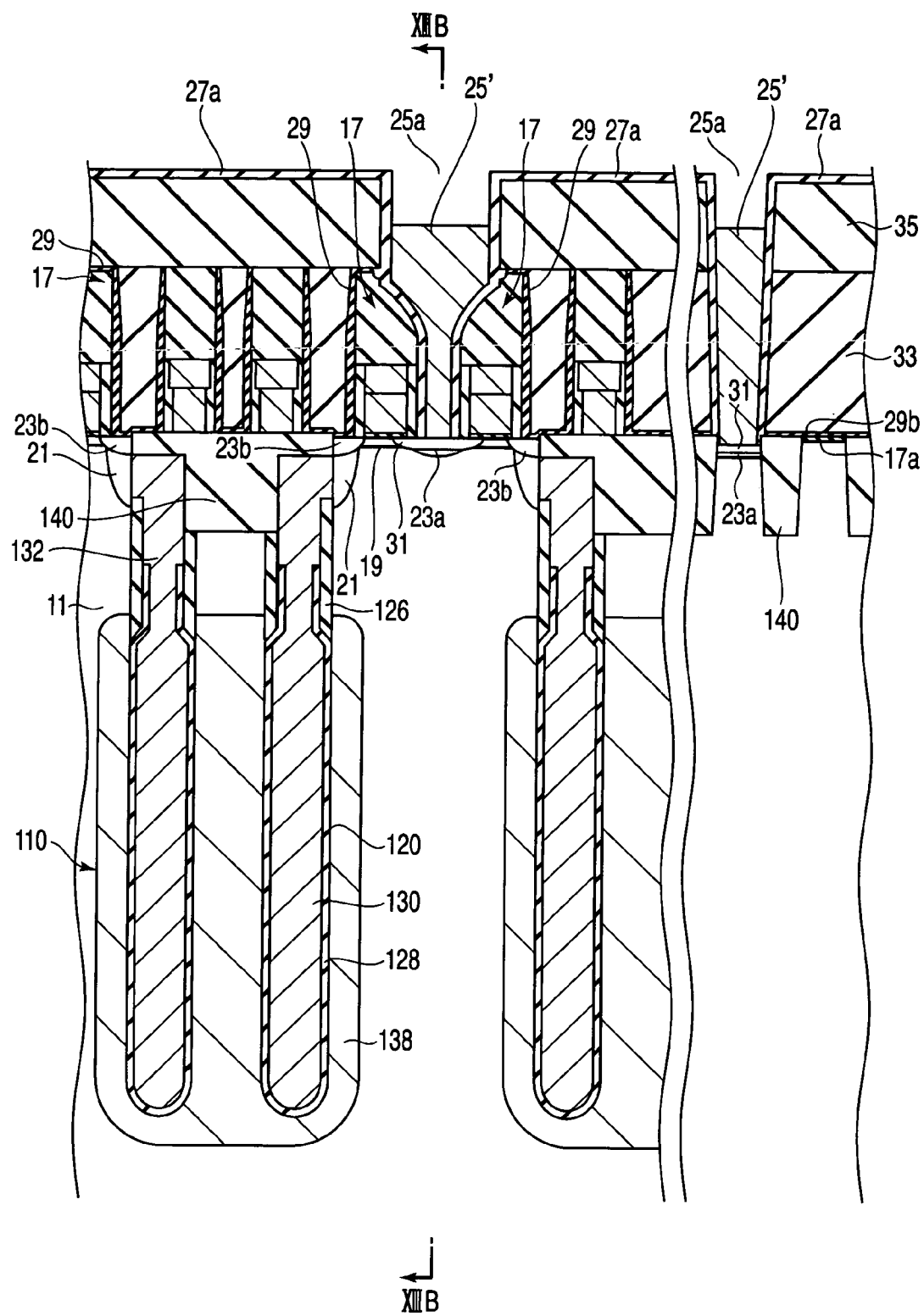
FIGS. 13A and 13B are process sectional views illustrating a method of manufacturing the DRAM shown in FIGS. 1A and 1B.

The contact hole 25a is filled with polysilicon 25' that is a conductive material to form the CB 25 (see FIG. 13A and FIG. 13B taken along line XIIIB—XIIIB of FIG. 13A).

The second interlayer film 35 and SiO₂ film 27a are etched back to form a second side-wall insulating film 27 and a CB 25 with the film 27 on its sides. After that, a bit line BL is formed on the second interlayer film 35 and connected to the CB 25. Thus, the above DRAM shown in FIGS. 1A and 1B is completed.

In the first embodiment, the impurity concentration of the diffusion preventing layer 31 reaches its peak on the surface of the semiconductor substrate 11 immediately under the end portions of the gate electrode sections 17 and 17. In the prior art (halo I/I performed while no spacer peels off), it reaches its peak near the surface of the semiconductor substrate 11 under the first side-wall insulating film 29.

As described above, the diffusion preventing layer 31 is formed after the first side-wall insulating film 29, which is close to the CB 25, peels off. The layer 31 is therefore easier to form by CB halo I/I than conventional. In other words, the diffusion preventing layer 31 is formed by CB halo I/I while the spacer peels off each of the side-walls of the gate electrode sections 17 and 17, which are close to the CB 25. Even though the gate-to-gate space is narrow, the impurities whose conductivity type is opposite to that of the diffusion layer 23a can be ion-implanted exactly into the surface area of the semiconductor substrate 11 corresponding to the edges of the gate electrode sections 17 and 17, which are close to at least the CB 25. Even though the gate length of each of the gate electrode sections 17 and 17 is shortened, the problem that the cell transistors decrease in threshold voltage can be circumvented.

The diffusion preventing layer 31 can be formed by CB halo I/I more easily particularly when the upper portion of the contact hole 25a is expanded by removing part of the second interlayer film 35 by a pullback.

The diffusion preventing layer 31 is formed using the second interlayer film 35 as a mask. Mask-less CB halo I/I that requires no resist mask can be performed.

The second side-wall insulating film 27 that includes the SiO₂ film 27a is formed between the CB 25 and each of the gate electrode sections 17 and 17 and along either side of the CB 25. The bit line capacity can thus be reduced more than when the SiN film is used.

Second Embodiment

Figures 14A, 14B:
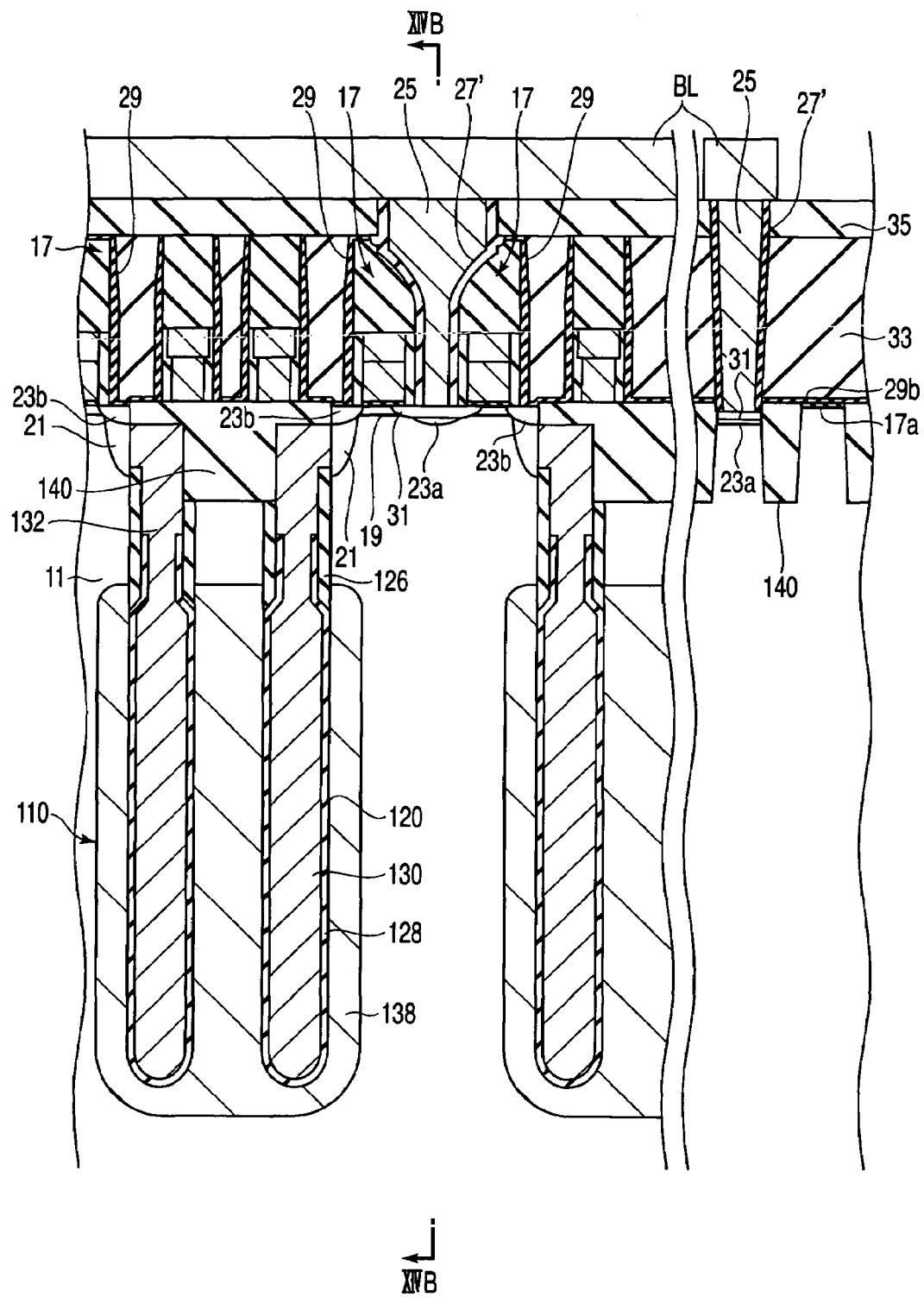
FIGS. 14A and 14B are sectional views of the principal part of a DRAM according to a second embodiment of the present invention.

FIGS. 14A and 14B show the configuration of a DRAM according to a second embodiment of the present invention. FIG. 14A is a sectional view of the principal part (DRAM cell) of the DRAM, and FIG. 14B is a sectional view taken along line XIVB—XIVB of FIG. 14A. The same components as those of FIGS. 1A and 1B are denoted by the same reference numerals and their detailed descriptions are omitted.

In the first embodiment described above, the second side-wall insulating film 27 of an SiO₂ film whose dielectric constant is lower than that of the SiN film is formed on the side-wall portion of each of the gate electrode sections 17 and 17 (either side of the CB 25), from which the first side-wall insulating film (spacer) is peeled. The present invention is not limited to this formation. For example, a second side-wall insulating film 27' of a SiN film can be formed again, as shown in FIGS. 14A and 14B.

In the second embodiment, the bit line capacity cannot be reduced, but the diffusion preventing layer 31 can easily be formed by mask-less CB halo I/I, as in the above first embodiment.

Third Embodiment

Figures 15A, 15B:
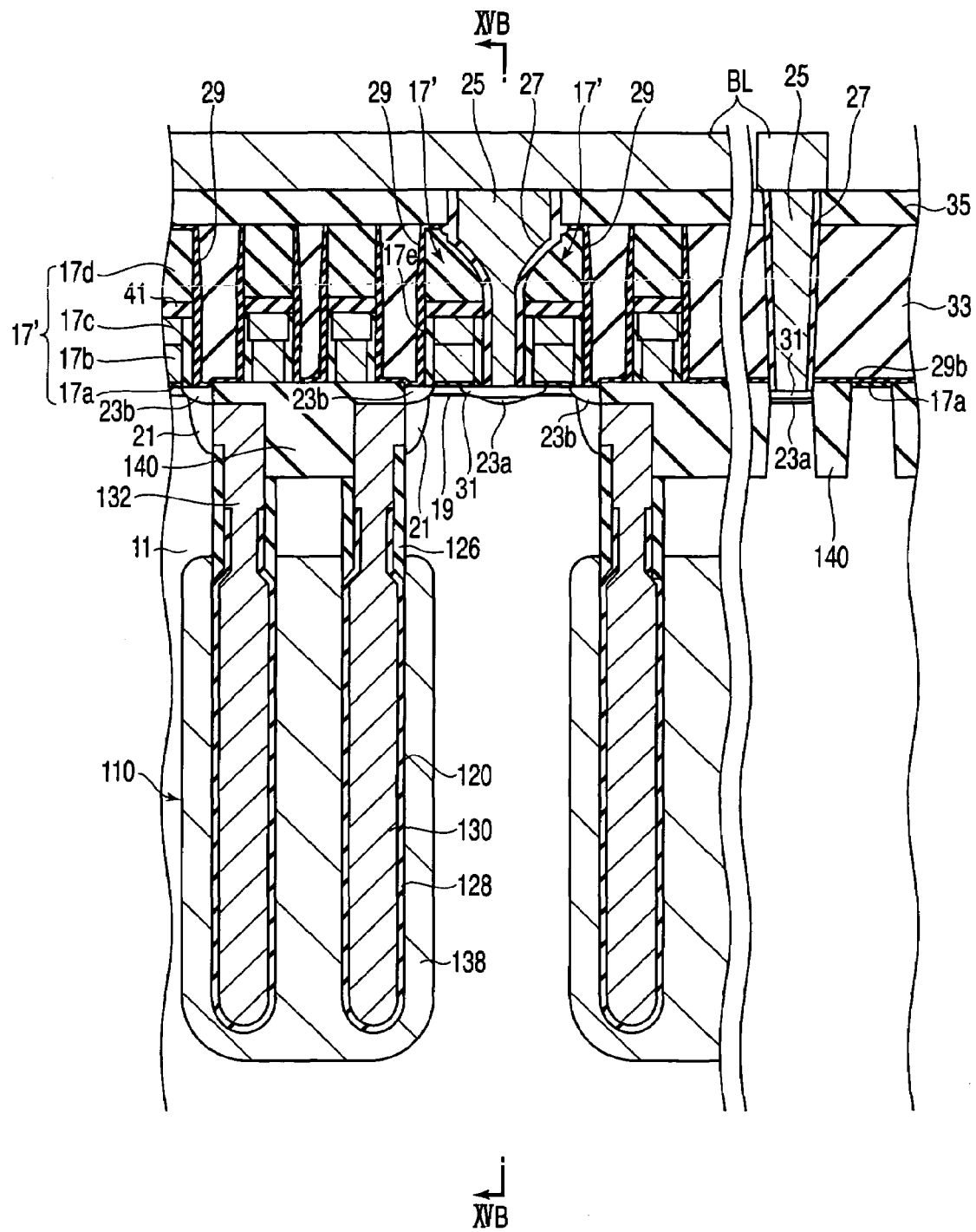
FIGS. 15A and 15B are sectional views of the principal part of a DRAM according to a third embodiment of the present invention.

FIGS. 15A and 15B show the configuration of a DRAM according to a third embodiment of the present invention. FIG. 15A is a sectional view of the principal part (DRAM cell) of the DRAM, and FIG. 15B is a sectional view taken along line XVB-XVB of FIG. 15A. The same components as those of FIGS. 1A and 1B are denoted by the same reference numerals and their detailed descriptions are omitted.

In the third embodiment, an electrode layer (e.g., polysilicon film) 17b, a silicide layer (e.g., WSi film) 17c, a protecting layer (e.g., $SiO_2$ film) 41 and a cap layer (e.g., SiN film) 17d are formed in sequence one on another on a gate oxide film 17a. In this configuration, even though overetching occurs when the first side-wall insulating film (spacer), which is close to the CB 25, peels off, the protecting layer 41 can prevent its underlying silicide layer 17c from being exposed to the contact hole 25a.

The third embodiment can be applied to the DRAM according to the second embodiment (shown in FIGS. 14A and 14B) as well as the DRAM according to the first embodiment. In other words, it can be applied to a DRAM in which a second side-wall insulating film 27' of a SiN film is formed again on either side of the CB 25.

All the embodiments described above can be applied to various DRAM-embedded semiconductor memory devices as well as DRAMs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a semiconductor substrate;
   at least two gate electrode sections formed adjacent to each other on a surface of the semiconductor substrate;
   a first diffusion region formed in a surface area of the semiconductor substrate, except in the gate electrode sections;
   a substrate contact layer formed between the gate electrode sections in self-alignment with the gate electrode sections;
   a first side-wall insulating film formed on one of side-wall portions of each of the gate electrode sections, the first side-wall insulating film including a first oxide film and a first insulating film;
   a second side-wall insulating film formed on other of the side-wall portions of each of the gate electrode sections, the second side-wall insulating film including the first oxide film and a second insulating film, the second insulating film being formed to extend to a portion above the substrate contact layer; and
   a second diffusion region whose conductivity type is opposite to that of the first diffusion region, formed in the surface area of the semiconductor substrate and corresponding to each of edges of the gate electrode sections, the edges corresponding to the other of the side-wall portions,
   wherein the second insulating film is formed along a side of the substrate contact layer.

2. A semiconductor device, comprising:
   a semiconductor substrate;
   at least two gate electrode sections formed adjacent to each other on a surface of the semiconductor substrate;
   a first diffusion region formed in a surface area of the semiconductor substrate, except in the gate electrode sections;
   a substrate contact layer formed between the gate electrode sections in self-alignment with the gate electrode sections;
   a first side-wall insulating film formed on one of side-wall portions of each of the gate electrode sections, the first side-wall insulating film including a first oxide film and a first insulating film;
   a second side-wall insulating film formed on other of the side-wall portions of each of the gate electrode sections, the second side-wall insulating film including the first oxide film and a second insulating film, the second insulating film being formed to extend to a portion above the substrate contact layer; and
   a second diffusion region whose conductivity type is opposite to that of the first diffusion region, formed in the surface area of the semiconductor substrate and corresponding to each of edges of the gate electrode sections, the edges corresponding to the other of the side-wall portions,
   wherein the second insulating film has a dielectric constant which is lower than that of the first insulating film.

3. A semiconductor device, comprising:
   a semiconductor substrate;
   at least two gate electrode sections formed adjacent to each other on a surface of the semiconductor substrate;
   a first diffusion region formed in a surface area of the semiconductor substrate, except in the gate electrode sections;
   a substrate contact layer formed between the gate electrode sections in self-alignment with the gate electrode sections;
   a first side-wall insulating film formed on one of side-wall portions of each of the gate electrode sections, the first side-wall insulating film including a first oxide film and a first insulating film;
   a second side-wall insulating film formed on other of the side-wall portions of each of the gate electrode sections, the second side-wall insulating film including the first oxide film and a second insulating film, the second insulating film being formed to extend to a portion above the substrate contact layer;
   a second diffusion region whose conductivity type is opposite to that of the first diffusion region, formed in the surface area of the semiconductor substrate and corresponding to each of edges of the gate electrode sections, the edges corresponding to the other of the side-wall portions; and
   a trench capacitor formed in the surface area of the semiconductor substrate.

* * * * *